(12) United States Patent
Kim

(10) Patent No.: US 7,248,519 B2
(45) Date of Patent: Jul. 24, 2007

(54) SEMICONDUCTOR DEVICE THAT INITIALIZES MEMORY CELLS OF AN ACTIVATED WORDLINE GROUP

(75) Inventor: Min-Kyu Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 181 days.

(21) Appl. No.: 11/188,055

(22) Filed: Jul. 22, 2005

(65) Prior Publication Data
US 2006/0018145 A1  Jan. 26, 2006

(30) Foreign Application Priority Data
Jul. 22, 2004  (KR)  ...................... 10-2004-0057156

(51) Int. Cl.
*G11C 11/00* (2006.01)
(52) U.S. Cl. ....................... 365/203; 365/154; 365/226
(58) Field of Classification Search ................ 365/154, 365/185.07, 185.25, 203, 230.04, 230.06, 365/226
See application file for complete search history.

(56) References Cited

U.S. PATENT DOCUMENTS

| | | | | |
|---|---|---|---|---|
| 4,984,201 A | * | 1/1991 | Sato et al. ................... | 365/154 |
| 5,062,079 A | * | 10/1991 | Tsuchida et al. ............. | 365/210 |
| 6,519,177 B1 | | 2/2003 | Brown ......................... | 365/154 |
| 6,724,672 B2 | * | 4/2004 | Nirschl ......................... | 365/203 |
| 6,888,202 B2 | * | 5/2005 | Kang et al. .................. | 257/391 |
| 6,888,768 B2 | * | 5/2005 | Sugio ........................... | 365/203 |

FOREIGN PATENT DOCUMENTS

| | | |
|---|---|---|
| JP | 03-084796 | 4/1991 |
| JP | 06-084366 | 3/1994 |
| JP | 07-262778 | 10/1995 |

* cited by examiner

*Primary Examiner*—Richard T. Elms
*Assistant Examiner*—Alexander Sofocleous
(74) *Attorney, Agent, or Firm*—F. Chau & Assoc., LLC

(57) ABSTRACT

A semiconductor device that initializes memory cells of an activated wordline group is provided. The device includes: a control signal generation circuit, which generates first and second control signals based on an activated setting signal and an initial data value during an initial value setting operation; a first power supply circuit, which supplies power to bitlines in response to the first control signal; a second power supply circuit, which supplies power to complementary bitlines in response to the second control signal; a plurality of wordlines connected to respective memory cells; and a row decoder, which selects a group of wordlines from among the plurality of wordlines based on the setting signal and a selection address and simultaneously activates the selected group of wordlines.

17 Claims, 7 Drawing Sheets

SEMICONDUCTOR DEVICE THAT INITIALIZES MEMORY CELLS OF AN ACTIVATED WORDLINE GROUP

CROSS-REFERENCE TO RELATED APPLICATION

This application claims priority to Korean Patent Application No. 10-2004-0057156, filed on Jul. 22, 2004, in the Korean Intellectual Property Office, the disclosure of which is incorporated herein in its entirety by reference.

TECHNICAL FIELD

The present invention relates to a semiconductor device, and more particularly, to a semiconductor device that initializes a plurality of SRAMs of an activated wordline group.

DISCUSSION OF THE RELATED ART

Cache memories are used for storing data processed in a system-on-chip (SOC) and for enhancing the operating speed of a CPU. Synchronous SRAMs, which operate in synchronization with a system clock signal, are typically used as cache memories.

Synchronous SRAMs, however, are volatile memories, thus they can only store data when they are powered on. Therefore, when synchronous SRAMs are powered on, data stored in each of the synchronous SRAMs is initialized to a predetermined data value (e.g., a data value of 1 or 0).

FIG. 1 is a circuit diagram of a conventional SRAM module. Referring to FIG. 1, a precharge circuit 110 precharges a plurality of pairs of bitlines BL0 and BLb0 . . . BLn and BLbn to a power supply voltage VDD when a precharge control signal PREL becomes logic low.

A logic decoder 120 decodes a row address XADD and activates one of a plurality of wordlines WL0 through WLn corresponding to the decoded row address XADD. A column decoder 130 decodes a column address YADD and selects one of the pairs of bitlines BL0 and BLb0 . . . BLn and BLbn corresponding to the decoded column address YADD.

A write buffer 140 transmits data INDATA to the column decoder 130 in response to a write enable signal WE. A sense amplifier 150 amplifies a difference between signals BL and BLb output from the column decoder 130, thereby generating an output signal OUTDATA.

FIG. 2 is a timing diagram illustrating a data write operation of the conventional SRAM module of FIG. 1. Referring to FIGS. 1 and 2, suppose that the row decoder 120 activates the wordline WL0, and the column decoder 130 selects the pair of bitlines BLn and BLbn. During a write cycle, the wordline WL0 is activated, and then 1-word or 1-byte data INDATA input to the write buffer 140 is written into an SRAM cell 111 via the selected pair of bitlines BLn and BLbn.

In order to initialize each of a plurality of SRAM cells, each of the wordlines WL0 through WLn should be activated. Accordingly, as the number of SRAM cells increases, the time and power required for initializing each of the SRAM cells increase.

SUMMARY OF THE INVENTION

The present invention provides an SRAM module, which can reduce the time and power consumed initializing SRAM cells, and a controller for controlling the SRAM module.

According to an aspect of the present invention, there is provided a semiconductor device. The semiconductor device includes: a control signal generation circuit, which generates first and second control signals based on a activated setting signal and an initial data value during an initial value setting operation; a first power supply circuit, which supplies power to bitlines in response to the first control signal; a second power supply circuit, which supplies power to complementary bitlines in response to the second control signal; a plurality of wordlines connected to respective memory cells; and a row decoder, which selects a group of wordlines from among the plurality of wordlines based on the setting signal and a selection address and simultaneously activates the selected group of wordlines.

The first and second control signals generated by the control signal generation circuit may not be activated at the same time.

The selection address may include a most significant bit (MSB) of a row address input to the row decoder.

The number K of wordlines selected based on the setting signal and the selection address may be determined by using the following equation:

$$K = \frac{M}{2^N}$$

where M is a total number of wordlines, and N is the size in bits of the selection address.

According to another aspect of the present invention, there is provided a semiconductor device having a plurality of SRAMs respectively connected to M wordlines. The semiconductor device includes: a control signal generation circuit, which generates first and second control signals based on a setting signal and an initial data value, the setting signal being activated during an initial value setting operation; one or more first power supplies, which precharge respective bitlines to a power supply voltage level in response to the first control signal; one or more second power supplies, which precharge respective complementary bitlines to the power supply voltage level in response to the second control signal; and a row decoder, which sequentially activates consecutive groups of wordlines based on the setting signal and a selection address, each of the consecutive groups having $M/2^N$ wordlines where M is a total number of wordlines in the semiconductor device, and N is the size in bits of the selection address.

The selection address may include an MSB of a row address and bits of the row address that are subsequent to the MSB.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1:
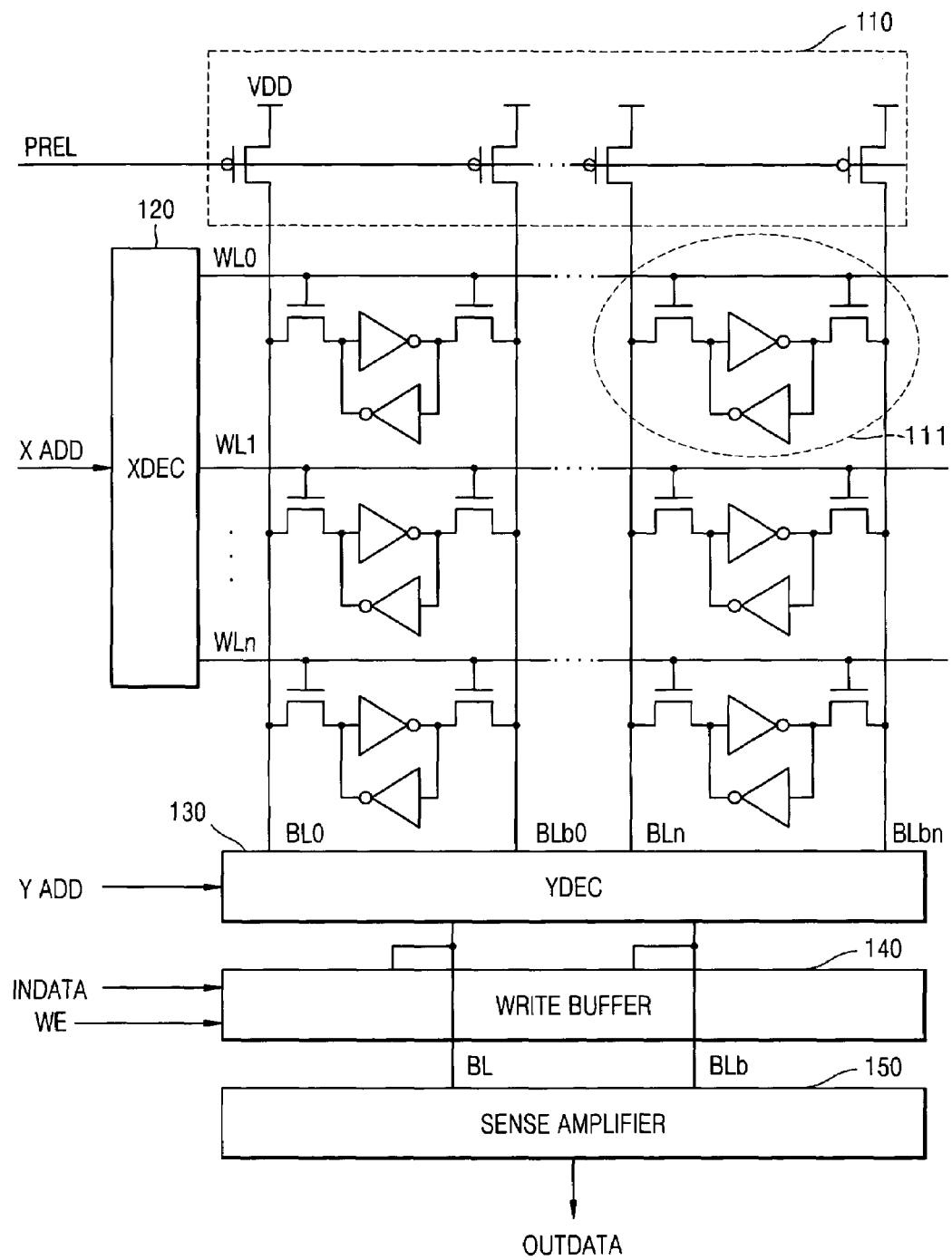
FIG. 1 is a circuit diagram of a conventional SRAM module.
Figure 2:
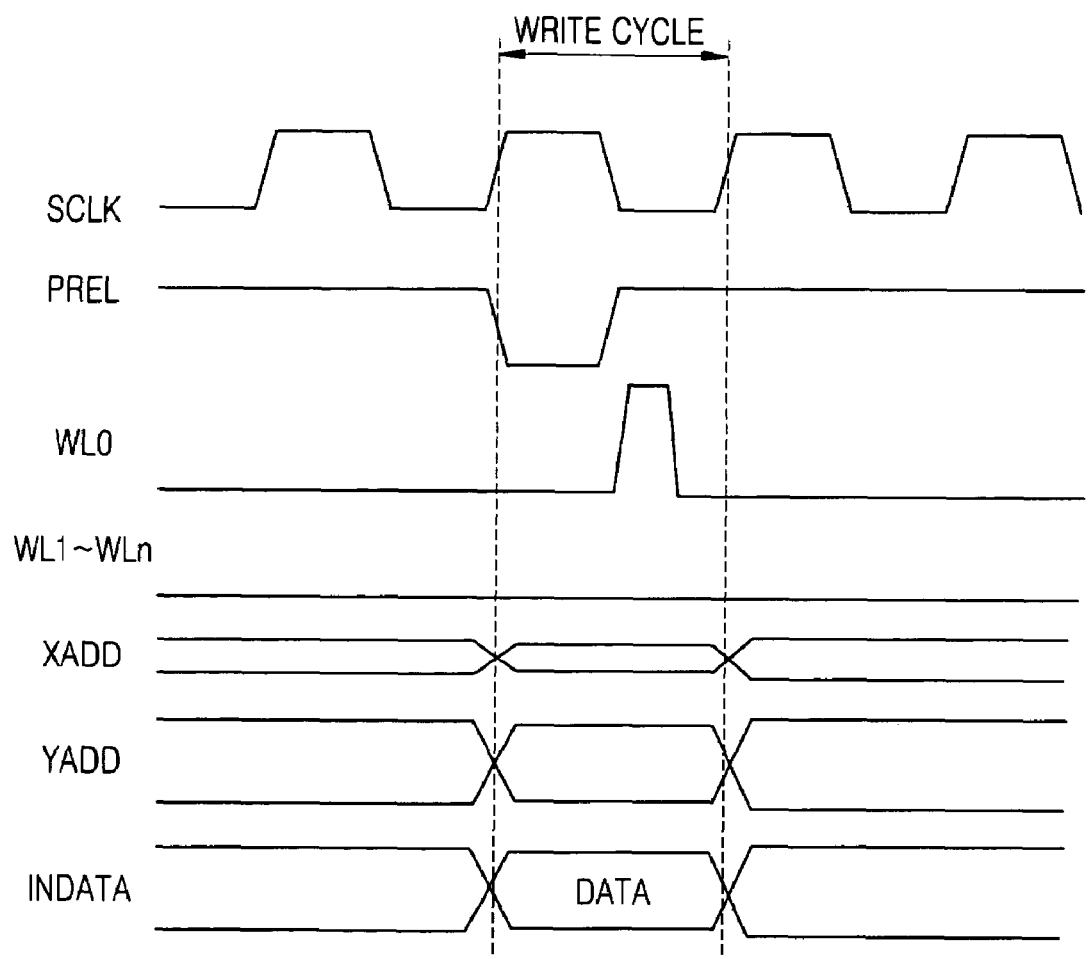
FIG. 2 is a timing diagram illustrating a data write operation of the conventional SRAM module of FIG. 1.

The present invention will now be described more fully with reference to the accompanying drawings, in which exemplary embodiments of the invention are shown. In the drawings, like reference numerals represent like elements.

Figure 3:
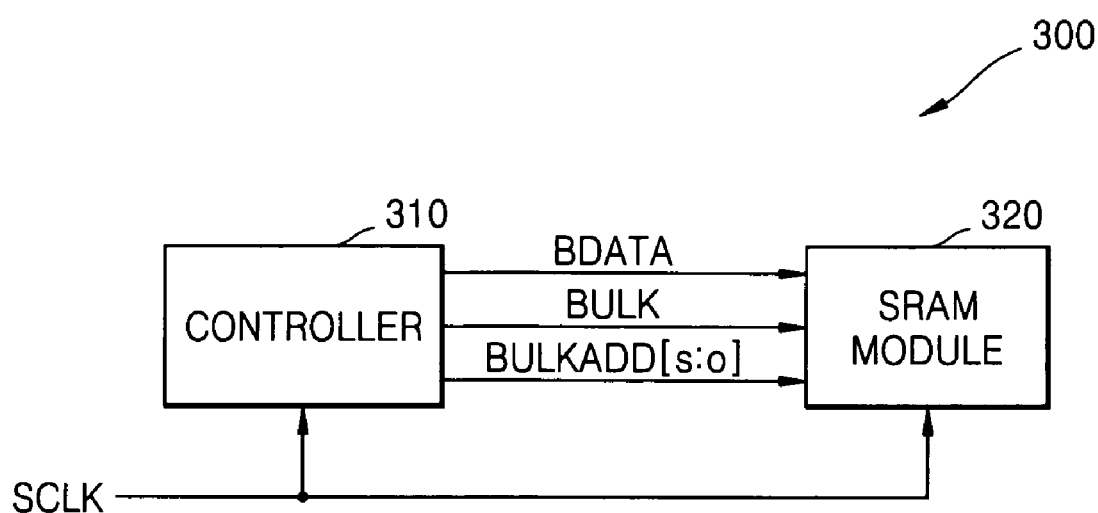
FIG. 3 is a block diagram of a system according to an exemplary embodiment of the present invention.

FIG. 3 is a block diagram of a system 300 according to an exemplary embodiment of the present invention. Referring to FIG. 3, the system 300 includes a controller 310 and an SRAM module 320 (e.g., a semiconductor device). The controller 310 and the SRAM module 320 operate in synchronization with a system clock signal SCLK.

Figure 4:
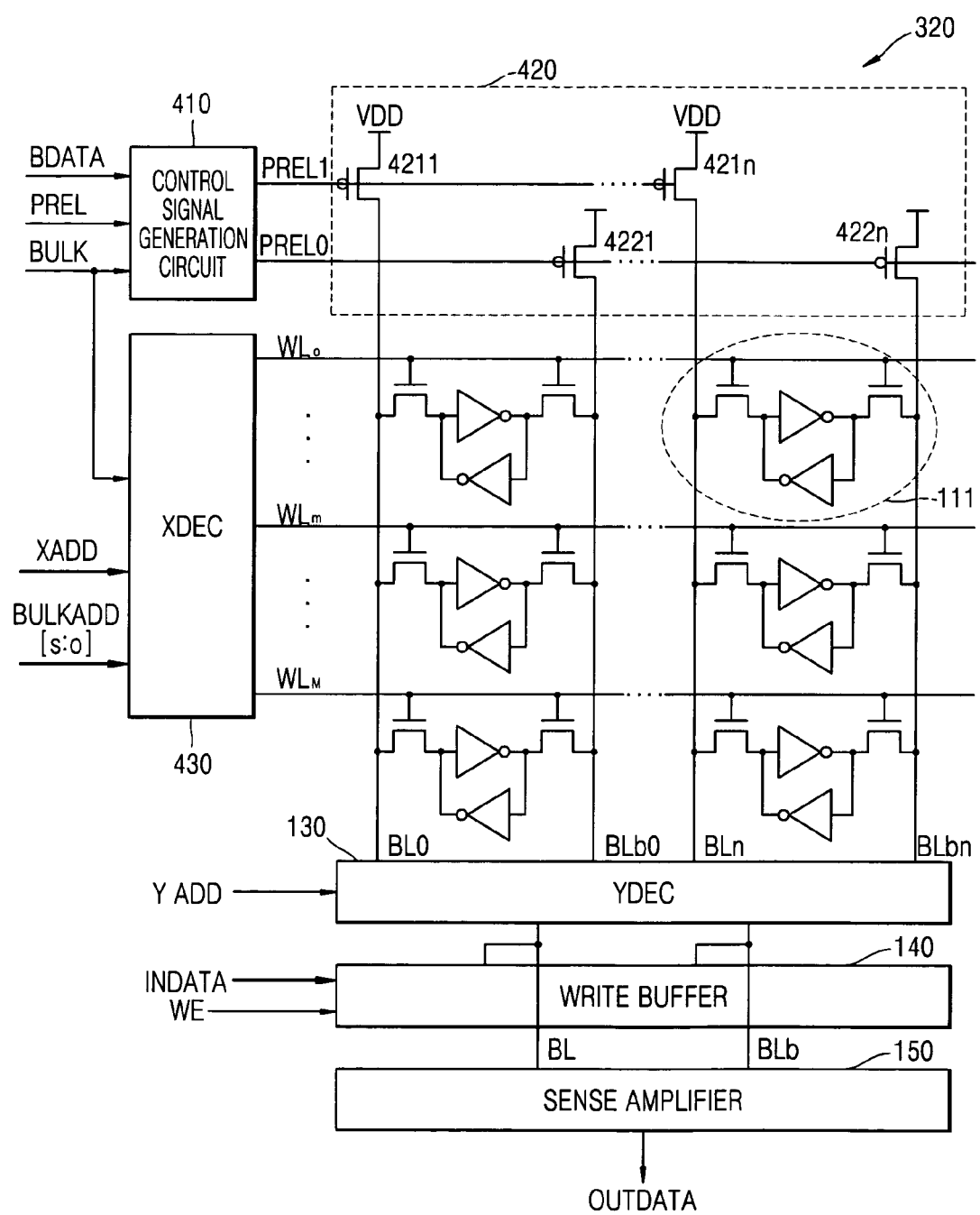
FIG. 4 is a circuit diagram of an SRAM module according to an exemplary embodiment of the present invention.

FIG. 4 is a circuit diagram of the SRAM module 320 of FIG. 3. Referring to FIG. 4, the SRAM module 320 includes a plurality of memory cells 111, a control signal generation circuit 410, a power supply circuit 420, a row decoder 430, a column decoder 130, a write buffer 140, and a sense amplifier 150.

The control signal generation circuit 410 generates a first control signal PREL0 and a second control signal PREL1 based on a setting signal BULK, an indication signal PREL, and an initial data value BDATA.

The setting signal BULK is activated by the controller 310, e.g., the setting signal BULK becomes logic high, when there is a need to set a data value of 0 or 1 in each of the memory cells 111 as an initial value. Accordingly, when the setting signal BULK is activated, the SRAM module 320 writes a data value of 0 or 1 into each of the memory cells 111 as an initial value. This operation is called an initial value setting.

Figure 5:
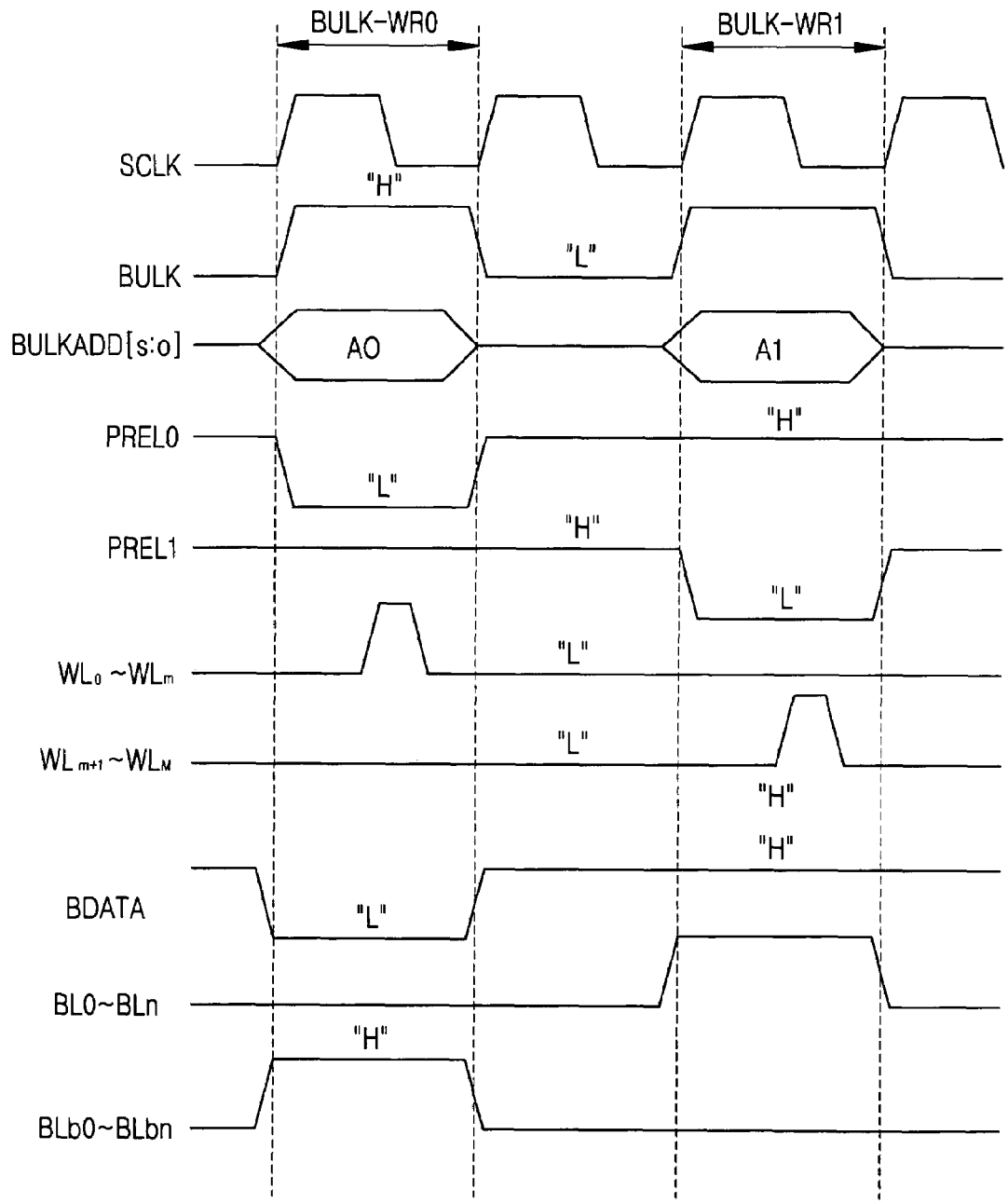
FIG. 5 is a timing diagram illustrating a data write operation of the SRAM module of FIG. 4.

Referring to FIG. 5, during the initial value setting operation, the control signal generation circuit 410 generates the first and second control signals PREL0 and PREL1 based on the activated setting signal BULK and the initial data value BDATA.

When the setting signal BULK is deactivated, e.g., at logic low, the first and second control signals PREL0 and PREL1 have the same value as an indication signal PREL. This mode is called a normal mode.

The power supply circuit 420 includes one or more first power supplies 4211 through 421n and one or more second power supplies 4221 through 422n.

Each of the first power supplies 4211 through 421n may be a PMOS transistor. The first power supplies 4211 through 421n are connected between a power supply voltage VDD and the respective bitlines BL0 through BLn. The first control signal PREL0 is input to a gate of each of the first power supplies 4211 through 421n.

Each of the second power supplies 4221 through 422n may be a PMOS transistor. The second power supplies 4221 through 422n are connected between the power supply voltage VDD and the respective complementary bitlines BLb0 through BLbn. The second control signal PREL1 is input to a gate of each of the second power supplies 4221 through 422n.

The row decoder 430 receives the setting signal BULK, a row address XADD, and a selection address BULKADD[s:0].

In the normal mode, when the setting signal BULK is deactivated, the row decoder 430 receives the row address XADD, decodes the received row address XADD, and simultaneously selects and activates some of a plurality of wordlines $WL_0$ through $WL_M$ corresponding to the decoded row address XADD. Hereinafter, a group of wordlines that are simultaneously activated are referred to as unit wordlines. However, if the setting signal BULK is activated, the row decoder 430 receives a selection address BULKADD[s:0], decodes the received row address XADD, and simultaneously selects and activates K wordlines. Then, SRAM cells connected to the unit wordlines activated by the row decoder 430 are simultaneously initialized. Hereinafter, a plurality of SRAM cells simultaneously initialized are referred to as unit SRAM cells. The number K of unit wordlines, which are wordlines simultaneously activated by the row decoder 430 in response to a row address, is defined by Equation (1):

$$K = \frac{M}{2^N} \tag{1}$$

where M is a total number of wordlines $WL_0$ through $WL_M$, and N is the size in bits of the selection address BULKADD[s:0]. The selection address BULKADD[s:0] includes a most significant bit (MSB) of the row address XADD.

For example, suppose that M is 512, and N is 2. The row decoder 430 sequentially activates 128 unit wordlines in response to a selection address BULKADD[1:0] including BULKADD[00], BULKADD[01], BULKADD[10], and BULKADD[11].

The operations of the column decoder 130, the write buffer 140, and the sense amplifier 150 are the same as or similar to the operations of their respective counterparts of FIG. 1 and will not be discussed hereinafter.

FIG. 5 is a timing diagram of a data write operation of the SRAM module 320 of FIG. 4. Referring to FIGS. 3 through 5, suppose that during a data write operation, in an initial value setting operation, a data value of "0" or "1" is simultaneously written into each of a plurality of unit SRAM cells. Writing a data value of "0" into each of the unit SRAM cells is referred to as BULK-WR0, and writing a data value of "1" into each of the unit SRAM cells is referred to as BULK-WR1.

In the case of BULK-WR0, the controller 310 outputs the setting signal BULK, which is activated, an initial data value BDATA, which is set to a ground voltage level (e.g., a data value of "0" or a logic low level), and a selection address BULKADD[0] composed of the MSB (=0) of the row address XADD, to the SRAM module 320.

The control signal generation circuit 410 generates the first control signal PREL0, which is logic low (L), and the second control signal PREL1, which is logic high (H), based on the initial data value BDATA (=0). Then, the second power supplies 4221 through 422n precharge their respective complementary bitlines BLb0 through BLbn to a power supply voltage level in response to the first control signal PREL0.

The bitlines BL0 through BLn are floating, so they have values driven by their respective SRAM cells.

The row decoder 430 simultaneously selects or activates half of the wordlines $WL_0$ through $WL_M$, e.g., the wordlines $WL_0$ through $WL_m$, in response to a selection address BULKADD[0]=A0 by using Equation (1) above.

SRAM memory cells, which are connected to the wordlines $WL_0$ through $WL_m$ and simultaneously activated by the row decoder 430, simultaneously store a data value of "0". In other words, a data value of "0" is simultaneously written into each of the SRAM memory cells connected to the activated wordlines $WL_0$ through $WL_m$.

In the case of BULK-WR1, the controller 310 outputs a selection address BULKADD[1], composed of the setting signal BULK, which is activated, the initial data value BDATA, which is set to a power supply voltage level (e.g., VDD or a logic high level), and the MSB (=1) of the row address XADD, to the SRAM module 320.

The control signal generation circuit 410 generates the first control signal PREL0, which is logic high (H), and the second control signal PREL1, which is logic low, based on the setting signal BULK, which is activated, and the initial data value BDATA (=1).

The first power supplies 4211 through 421n precharge the respective bitlines BL0 through BLn to the power supply voltage level (VDD) in response to the second control signal PREL1.

The complementary bitlines BLb0 through BLbn are floating, so they have values driven by their respective SRAM cells.

The row decoder 430 simultaneously selects or activates the other half of the wordlines $WL_0$ through $WL_M$, e.g., the wordlines $WL_{m+1}$ through $WL_M$, in response to a selection address BULKADD[1]=A1 by using Equation (1) above.

SRAM memory cells, which are connected to the wordlines $WL_{m+1}$ through $WL_M$ and simultaneously activated by the row decoder 430, simultaneously store a data value of "0". In other words, a data value of "0" is simultaneously written into each of the SRAM memory cells connected to the activated wordlines $WL_{m+1}$ through $WL_M$.

Figure 6:
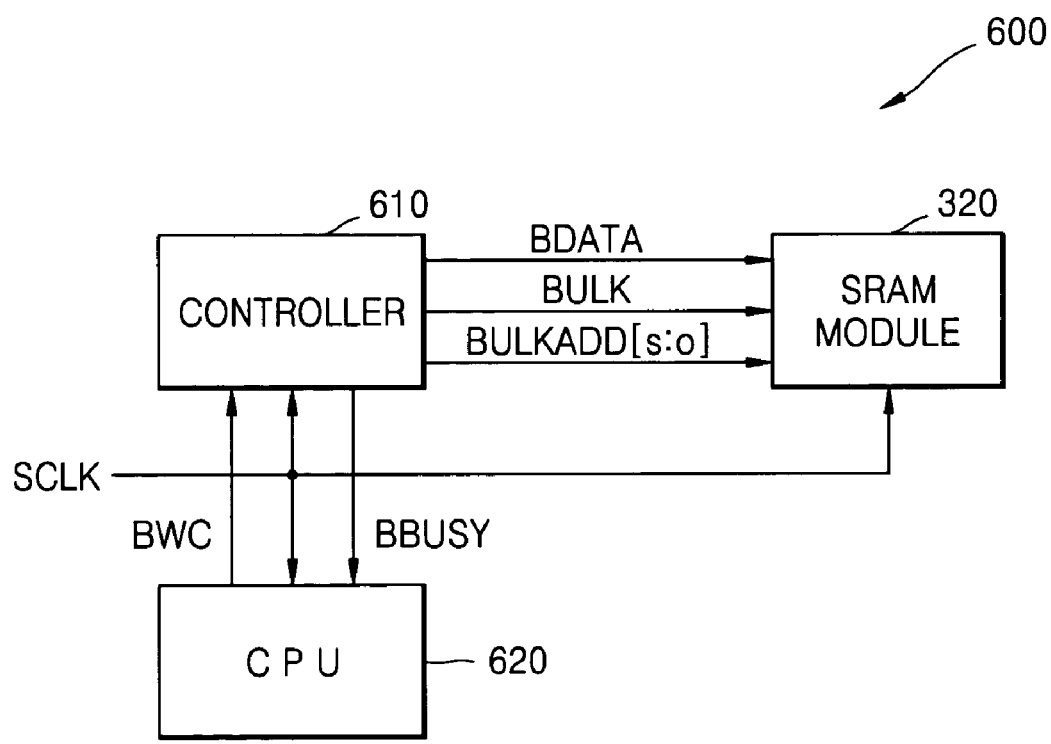
FIG. 6 is a block diagram of a system according to another exemplary embodiment of the present invention.

FIG. 6 is a block diagram of a system 600 according to another exemplary embodiment of the present invention. Referring to FIG. 6, the system 600 includes a controller 610, an SRAM module 320, and a CPU 620. The controller 610, the SRAM module 320, and the CPU 620 operate in synchronization with a system clock signal SCLK.

The CPU 620 outputs to the controller 610 a data write command BWC. The controller 610 transmits a setting signal BULK, an initial data value BDATA, and a setting address BULKADD[s:0] to the SRAM module 320 in response to the data write command BWC. The controller 610 transmits a signal BBUSY indicating that the SRAM module 320 is currently performing an initial value setting operation to the CPU 620.

Figure 7:
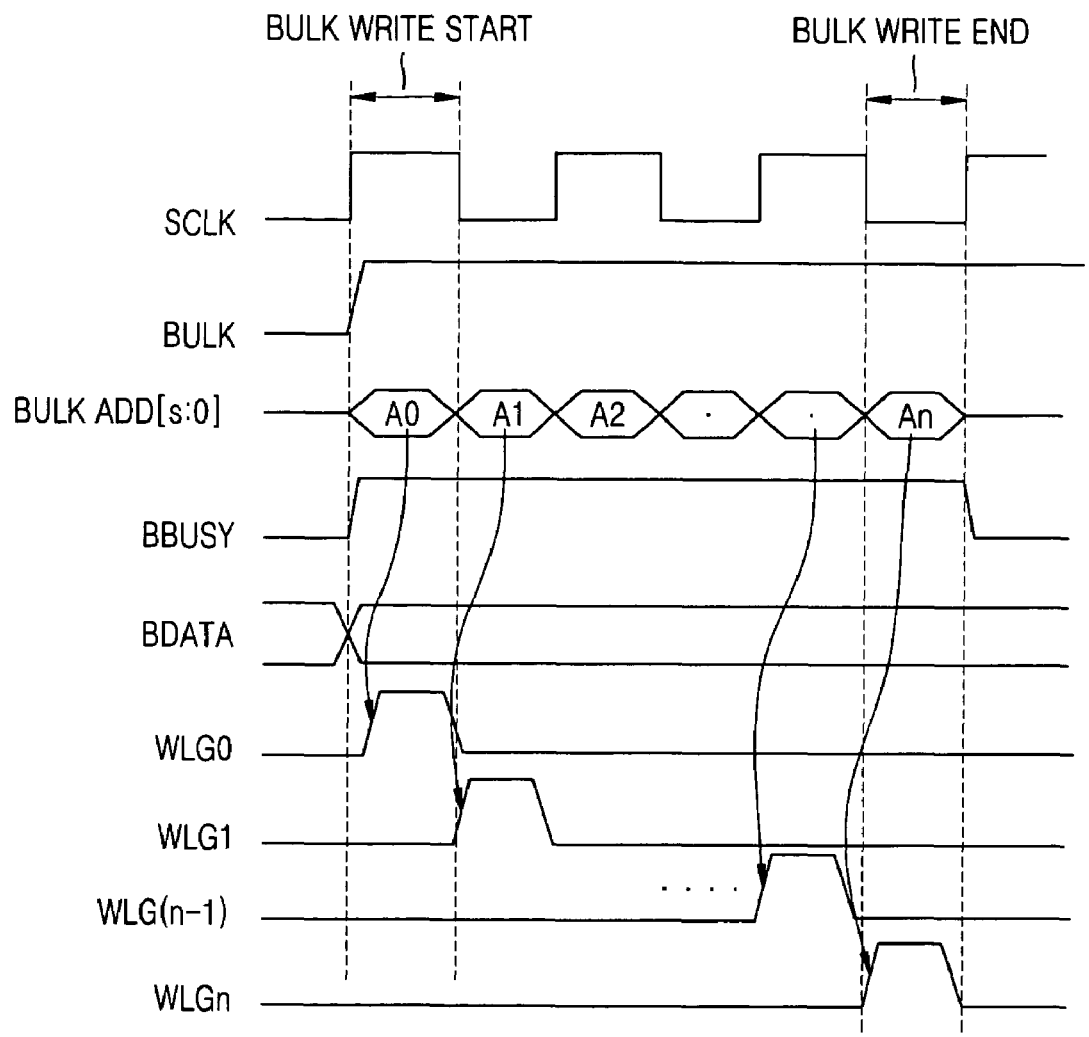
FIG. 7 is a timing diagram of a data write operation of an SRAM module of FIG. 6.

FIG. 7 is a timing diagram illustrating a data write operation of the SRAM module 320 of FIG. 6. The activation of K unit wordlines, which is performed in the row decoder 430 of the SRAM module 320, will be described in detail with reference to FIGS. 4, 6, and 7. Here, K is defined by Equation (1) above.

The controller 310 outputs the setting signal BULK, which is activated, and the initial data value BDATA to the SRAM module 320. In addition, the controller 310 sequentially outputs selection addresses A0=BULKADD[00], A1=BULKADD[01], A2=BULKADD[10], and A3=BULKADD[11] to the SRAM module 320 in response to a rising edge and a falling edge of the system clock signal SCLK. Each of the selection addresses A0=BULKADD[00], A1=BULKADD[01], A2=BULKADD[10], and A3=BULKADD[11] includes an MSB of the row address XADD and is composed of 2 bits.

The row decoder 430 simultaneously selects or activates a first group WLG0 of wordlines (e.g., 128 wordlines), which accounts for one fourth of a total of wordlines (e.g., 512 wordlines), in response to the selection address A0=BULKADD[00] by using Equation (1) above.

Then, a plurality of SRAM cells, connected to the first group WLG0 of wordlines activated by the row decoder 430, simultaneously store the same initial data value BDATA.

The row decoder 430 simultaneously selects or activates a second group WLG1 of wordlines (e.g., 128 wordlines), which accounts for another one fourth of the total of wordlines (e.g., 512 wordlines), in response to the selection address A1=BULKADD[01] by using Equation (1) above.

Then, a plurality of SRAM cells, connected to the second group WLG1 of wordlines activated by the row decoder 430, simultaneously store the same initial data value BDATA.

The row decoder 430 simultaneously selects or activates a third group WLGn-1 of wordlines (e.g., 128 wordlines), which accounts for yet still another one fourth of the total of wordlines (e.g., 512 wordlines), in response to the selection address A2=BULKADD[10] by using Equation (1) above.

Then, a plurality of SRAM cells, connected to the third group WLGn-1 of wordlines activated by the row decoder 430, simultaneously store the same initial data value BDATA.

The row decoder 430 simultaneously selects or activates a fourth group WLGn of wordlines (e.g., 128 wordlines), which accounts for the remainder of the total of wordlines (e.g., 512 wordlines), in response to the selection address An=A3=BULKADD[11] by using Equation (1) above.

Then, a plurality of SRAM cells, connected to the fourth group WLGn of wordlines activated by the row decoder 430, simultaneously store the same initial data value BDATA.

In the initial value setting operation, the number K of unit wordlines may vary depending on the size in bits of each selection address.

The semiconductor device having an SRAM module according to an exemplary embodiment of the present invention performs typical SRAM operations in the normal mode. However, when performing an initial value setting operation, the semiconductor device can simultaneously activate a group of wordlines, thus reducing the time required for initializing SRAM cells.

As described above, the semiconductor device can initialize memory cells at high speeds by simultaneously activating a group of wordlines while performing an initial value setting operation. Therefore, power consumed by the semiconductor device during the initial value setting operation can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a control signal generation circuit, which generates first and second control signals in response to an activated setting signal and an initial data value during an initial value setting operation;
   a first power supply circuit, which supplies power to bitlines in response to the first control signal;
   a second power supply circuit, which supplies power to complementary bitlines in response to the second control signal;
   a plurality of wordlines connected to a plurality of memory cells; and a row decoder, which selects a group of wordlines from the plurality of wordlines in response to the setting signal and a selection address and activates the selected group of wordlines.

2. The semiconductor device of claim 1, wherein the first and second control signals generated by the control signal generation circuit are not activated at the same time.

3. The semiconductor device of claim 1, wherein the selection address comprises a most significant bit (MSB) of a row address input to the row decoder.

4. The semiconductor device of claim 1, wherein a number K of wordlines selected in response to the setting signal and the selection address is determined by using the following equation;

where M is a total number of wordlines, and N is the size in bits of the selection address.

5. The semiconductor device of claim 1, wherein the first power supply circuit and the second power supply circuit each include a PMOS transistor.

6. The semiconductor device of claim 1, wherein the memory cells are SRAM cells.

7. The semiconductor device of claim 1, wherein the control signal generation circuit and row decoder are connected to a controller for generating me activated setting signal, initial data value and selection address.

8. A semiconductor device comprising a plurality of memory cells connected to M wordlines, the semiconductor device comprising:

a control signal generation circuit, which generates first and second control signals in response to an activated setting signal and an initial data value during an initial value setting operation;

a first power supply, which precharges bitlines to a power supply voltage level in response to the first control signal;

a second power supply, which precharges complementary bitlines to the power supply voltage level in response to the second control signal; and a row decoder, which activates groups of wordlines based on the setting signal and a selection address, each of the groups of wordlines comprising $M/2^N$ wordlines where N is a total number of wordlines in the semiconductor device, and N is the size in bits of the selection address.

9. The semiconductor device of claim 8, wherein selection address comprises a most significant bit (MSB) of a row address and bits of the row address that are subsequent to the MSB.

10. The semiconductor device of claim 8, wherein the first and second control signals generated by the control signal generation circuit are not activated at the same time.

11. The semiconductor device of claim 8, wherein the groups of wordlines are sequentially activated.

12. The semiconductor device of claim 8, wherein the control signal generation circuit and row decoder are connected to a controller for generating the activated setting signal, initial data value and selection address and a busy signal for indicating that the initial value setting operation is being performed.

13. The semiconductor device of claim 8, wherein the memory cells are SRAM cells.

14. A method for initializing memory cells, comprising:

generating, at a control signal generation circuit, first and second control signals in response to an activated setting signal and an initial data value during an initial value setting operation;

supplying, at a first power supply circuit, power to bitlines in response to the first control signal;

supplying, at a second power supply circuit, power to complementary bitlines, in response to the second control signal; and selecting, at a row decoder, a group of wordlines from a plurality of wordlines in response to the setting signal and a selection address and simultaneously activating the selected group of wordlines.

15. The method of claim 14, wherein the first and second control signals are not activated at the same time.

16. The method of claim 14, wherein the selection address comprises a most significant bit (MSB) of a row address input to the row decoder.

17. The method of claim 14, wherein a number K of wordlines selected in response to the setting signal and the selection address is determined by using the following equation:

$$K = \frac{M}{2^N}$$

where M is a total number of wordlines, and N is the size in bits of the selection address.

* * * * *